(12) United States Patent
Dannoux et al.

(10) Patent No.: US 9,611,165 B2
(45) Date of Patent: Apr. 4, 2017

(54) METHOD AND APPARATUS FOR BENDING A GLASS SHEET AND AN ELECTRONIC DEVICE CASING

(71) Applicant: Corning Incorporated, Corning, NY (US)

(72) Inventors: Thierry Luc Alain Dannoux, Avon (FR); Paul Louis Florent Delautre, Lisses (FR); Patrick Jean Pierre Herve, Avon (FR); Laurent Joubaud, Paris (FR)

(73) Assignee: CORNING INCORPORATED, Corning, NY (US)

( * ) Notice: Subject to any disclaimer, the term of this patent is extended or adjusted under 35 U.S.C. 154(b) by 283 days.

(21) Appl. No.: 13/908,158

(22) Filed: Jun. 3, 2013

(65) Prior Publication Data

US 2013/0329346 A1 Dec. 12, 2013

Related U.S. Application Data

(60) Provisional application No. 61/657,291, filed on Jun. 8, 2012.

(51) Int. Cl.
*C03B 23/023* (2006.01)
*H05K 5/00* (2006.01)
(Continued)

(52) U.S. Cl.
CPC ........ *C03B 23/0235* (2013.01); *C03B 23/023* (2013.01); *C03B 23/0256* (2013.01);
(Continued)

(58) Field of Classification Search
CPC .............. C03B 23/023; C03B 23/0235; C03B 23/0256; H05K 5/03
(Continued)

(56) References Cited

U.S. PATENT DOCUMENTS 3,628,934 A    12/1971   Duthoit et al. ................... 65/30
4,081,263 A *   3/1978   Mestre et al. ................... 65/106
(Continued)

FOREIGN PATENT DOCUMENTS

BE          775001       3/1972
CN       100339323 C     9/2007
(Continued)

OTHER PUBLICATIONS

European Patent Office; International Search Report; Mailing Date: Aug. 1, 2013; pp. 1-4.
(Continued)

*Primary Examiner* — Alison L Hindenlang
*Assistant Examiner* — Mohamed K Ahmed Ali
(74) *Attorney, Agent, or Firm* — John T. Haran (57) ABSTRACT

A method of bending a glass sheet includes placing the glass sheet on a support and heating the entire glass sheet to a first viscosity. A band of heat is applied and translated along the selected region of the glass sheet in which a predetermined is to be formed over a time period to form the predetermined in the selected region. The band of heat sectionally heats the selected region to a second viscosity that is lower than the first viscosity. An actuated force is applied to the glass sheet to incrementally form the predetermined bend in the selected region according to the location of the band of heat in the selected region.

12 Claims, 9 Drawing Sheets

(51) Int. Cl.
*H05K 5/03* (2006.01)
*C03B 23/025* (2006.01)

(52) U.S. Cl.
CPC ....... *C03B 23/0258* (2013.01); *H05K 5/0017* (2013.01); *H05K 5/03* (2013.01)

(58) Field of Classification Search
USPC .................................. 65/106, 271, 281, 29
See application file for complete search history.

(56) References Cited

U.S. PATENT DOCUMENTS

| | | | |
|---|---|---|---|
| 4,883,529 A * | 11/1989 | Nishimura | C03B 23/065 65/108 |
| 5,501,717 A | 3/1996 | Vehmas et al. | |
| 5,755,845 A | 5/1998 | Woodward et al. | |
| 6,232,783 B1 | 5/2001 | Merrill | |
| 7,285,899 B2 | 10/2007 | Nishimura et al. | |
| 8,446,711 B2 | 5/2013 | Liao et al. | |
| 8,549,885 B2 | 10/2013 | Dannoux et al. | |
| 8,833,106 B2 | 9/2014 | Dannoux et al. | |
| 9,284,212 B2 | 3/2016 | Dannoux et al. | |
| 2002/0020192 A1 | 2/2002 | Bader et al. | 65/33.1 |
| 2006/0164000 A1* | 7/2006 | Nishimura | H01J 9/247 313/489 |
| 2012/0131961 A1* | 5/2012 | Dannoux et al. | 65/103 |
| 2014/0144182 A1 | 5/2014 | Dannoux et al. | |

FOREIGN PATENT DOCUMENTS

| | | |
|---|---|---|
| CN | 100431090 C | 11/2008 |
| CN | 101948236 A | 1/2011 |
| CN | 102202476 A | 9/2011 |
| DE | 10039027 | 1/2002 |
| JP | 63-21229 | 1/1988 |
| JP | 11-322353 | 11/1999 |
| JP | 2003012334 A | 1/2003 |
| WO | 2005/042420 | 5/2005 |
| WO | 2013/055861 | 4/2013 |

OTHER PUBLICATIONS

Chinese First Office Action CN201380036742.3 Dated Jul. 12, 2016.

* cited by examiner

METHOD AND APPARATUS FOR BENDING A GLASS SHEET AND AN ELECTRONIC DEVICE CASING

This application claims the benefit of priority under 35 U.S.C §119 of U.S. Provisional Application Ser. No. 61/657,291 filed on Jun. 8, 2012 the content of which is relied upon and incorporated herein by reference in its entirety.

BACKGROUND

1. Field

The present invention relates to methods and apparatus for forming three-dimensional (3D) glass articles. The present invention relates to methods and apparatus for bending glass without using molds. The present invention relates to glass covers for electronic devices.

2. Background

Simple and complex 3D glass articles can be formed by conforming glass sheets to mold surfaces with the desired 3D profiles. The conforming is done while the glass is at a relatively low viscosity, typically $10^8$ to $10^{10}$ Poise. At this low viscosity, any contact between the glass and mold surface can result in imprinting of mold surface defects on the glass. In addition, depending on the mold material, the glass may stick to the mold surface, which would degrade the glass surface. For applications where glass aesthetics and strength are important, such as in glass covers for electronic devices, the mold surface would need to be free of defects and made of a material that would not stick to the glass at high temperatures to avoid the problems mentioned above. The cost of such a mold is high and increases as the article size increases. Also, because the glass is conformed to the mold surface, each new glass article shape will require a new mold design, even if the new shape is just a prototype. A new mold for each new shape will increase production costs and prototyping costs per article and hamper the ability of the manufacturer to respond to requests for new shapes quickly.

U.S. Provisional Application No. 61/546687 ("Thermo-mechanical reforming method and system and mechanical reforming tool") describes a method of forming 3D glass articles that does not involve use of molds. The method involves placing a glass sheet on a flat support and heating the glass sheet to a first temperature corresponding to a relatively high viscosity at which the glass cannot be permanently deformed. The glass sheet is then locally heated to a second temperature corresponding to a relatively low viscosity at which the glass can be permanently deformed. In the region affected by the local heating, temperature will rise from the first temperature to the second temperature. In the region unaffected by the local heating, temperature will be somewhat constant at or near the first temperature.

An actuated force is applied to the glass sheet. When the affected region is at the second temperature or relatively low viscosity, the actuated force will produce a bend in the affected region. A bend will not be produced in the unaffected region that is at a relatively high viscosity. The level of deformation in the affected region is controlled by the linear amplitude of the actuated force, and the radius of curvature in the affected region is controlled by the angular amplitude of the actuated force. However, these two controls do not allow easy fine-tuning of the bending profile in the affected region, which in reality depends on the local equilibrium between the bending momentum induced by the actuation force and the local glass viscosity. With this method, the bend profiles that can be achieved are somewhat limited to "natural profiles," which are composed from two straight regions and a nearly constant radius of curvature in between. More complex designs that can be mathematically expressed as a varying curvature radius depending on the curvilinear length of the glass may enable more interesting and useful shaped glass articles.

SUMMARY

In one aspect of the present invention, a method of bending a glass sheet includes placing the glass sheet on a support and heating the entire glass sheet to a first viscosity. The method includes applying and translating a band of heat along a selected region of the glass sheet in which a predetermined bend is to be formed over a time period to form the predetermined bend in the selected region. The band of heat sectionally heats the selected region to a second viscosity that is lower than the first viscosity. The method includes applying an actuated force to the glass sheet to incrementally form the predetermined bend in the selected region according to the location of the band of heat in the selected region.

In one embodiment, the first viscosity is in a range from $6 \times 10^9$ Poise to $10^{12}$ Poise.

In one embodiment, the second viscosity is less than or equal to $10^9$ Poise.

In one embodiment, a size of the selected region in a direction in which the band of heat is translated is greater than twice a size of the band of heat in the direction in which the band of heat is translated.

In one embodiment, placing the glass sheet on the support comprises allowing the selected region to overhang the support such that the support does not interfere with forming the predetermined bend in the selected region.

In one embodiment, the method further includes controlling a temperature of an environment in which the glass sheet is disposed to maintain the portion of the glass sheet not heated by the band of heat above the second viscosity.

In one embodiment, the method further includes selecting a bend profile corresponding to the predetermined bend, segmenting the bend profile into at least three profile segments, and applying the band of heat and actuated force to form each of the profile segments in a corresponding section of the selected region.

In one embodiment, the method further includes selecting a size of the band of heat based on a length of the smallest of the profile segments.

In one embodiment, applying the actuated force includes translating an actuator arm in contact with the selected region along a curvilinear path.

In one embodiment, the actuator arm is rotated through an angle between 0 and 90° over the time period in which the predetermined bend is formed.

In one embodiment, the actuator arm is rotated through an angle of of 90° or greater over the time period in which the predetermined bend is formed.

In one embodiment, the translation of the band of heat is at scheduled intervals over the time period.

In one embodiment, the translation of the band of heat is continuous over the time period.

In another aspect of the present invention, an apparatus for bending a glass sheet includes a glass sheet support and a heater for applying localized heat to the glass sheet when the glass sheet is on the glass sheet support. The apparatus includes a first mechanism coupled to the heater for translating the heater along a linear path in order to locally heat a selected region of the glass sheet when the glass sheet is on the glass sheet support. The apparatus includes an actuator arm for applying an actuated force to the glass sheet when the glass sheet is on the glass sheet support. The apparatus includes a second mechanism coupled to the actuator arm for translating the actuator arm along a curvilinear path in order to form a predetermined bend in the glass sheet when the glass sheet is on the glass sheet support.

In one embodiment, the first mechanism includes a pair of actuator arms arranged in parallel to the linear path and coupled to the local heater and an actuator for translating the pair of actuator arms along the linear path.

In one embodiment, the apparatus further includes means for compensating for drift in a location of the heater due to thermal expansion.

In one embodiment, the first mechanism is coupled to a first base support, the glass sheet support is coupled to a second base support, and the compensating means includes a rigid link between the first base support and the second base support.

In one embodiment, the rigid link is provided by a rigid bar that is arranged in parallel to the pair of actuator arms and that has thermal expansion characteristics matching those of the pair of actuator arms.

In one embodiment, the apparatus further includes means for compensating for drift in a location of the actuated arm due to thermal expansion.

In one embodiment, the second mechanism includes a pulley mechanism coupled to the actuator arm and an actuator for driving the pulley mechanism.

In one embodiment, the pulley mechanism is coupled to a first base support, the glass sheet is coupled to a second base support, and the compensating means comprises a rigid link between the first base support and the second base support.

In one embodiment, the rigid link is provided by a cable or belt of the pulley system.

In yet another aspect of the present invention, an electronic device casing includes a glass body having a front cover and side bends depending from opposite ends of the front cover without physical seams between the front cover and side bends. The side bends are curved and have bend angles larger than 90°. The front cover is flat. The glass body defines a housing for an electronic device.

In one embodiment, the glass body further includes at least one back flap adjoined to at least one of the side bends without a physical seam between the side bend and back flap, the back flap being in opposing relation to the front cover.

In one embodiment, the front cover is parallel to the back flap, and the back flap is flat.

In one embodiment, bend radiuses of the side bends are different such that the front cover is inclined to the back flap.

In one embodiment, the the side bends have bend angles of approximately 180°.

In one embodiment, the glass body is in the form of a full sleeve.

In one embodiment, the glass body is in the form of a fractional sleeve with a back window.

In one embodiment, the front cover has a clear aperture for interaction with a display device of the electronic device when the electronic device is arranged in the glass body.

It is to be understood that both the foregoing general description and the following detailed description are exemplary of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

DETAILED DESCRIPTION

In the following detailed description, numerous specific details may be set forth in order to provide a thorough understanding of embodiments of the invention. However, it will be clear to one skilled in the art when embodiments of the invention may be practiced without some or all of these specific details. In other instances, well-known features or processes may not be described in detail so as not to unnecessarily obscure the invention. In addition, like or identical reference numerals may be used to identify common or similar elements.

In one aspect of the present invention, a process of making a 3D glass article from a glass sheet has two major phases. In the first phase, the entire glass sheet is heated to a temperature $T_0 \pm \delta_0$, where $\delta_0$ is an error margin, e.g., less than 11% of $T_0$. At temperature $T_0 \pm \delta_0$, the glass has a relatively high viscosity, e.g., between $6 \times 10^9$ Poise and $10^{12}$ Poise. At temperature $T_0 \pm \delta_0$, deformation of the glass sheet or optical defects in the glass sheet can be avoided. Temperature $T_0 \pm \delta_0$ may be near the annealing point of the glass. In one embodiment, temperature $T_0 \pm \delta_0$ is within 10° C. of the annealing point.

In the second phase, localized heat, which has an effective size that is much smaller than the size of the bend region of the glass sheet, is applied to and translated along the bend region, heating the bend region in sections. The localized heat sectionally heats the bend region to a temperature $T_1 \pm \delta_1 > T_0 \pm \delta_0$, where $\delta_1$ is an error margin, e.g., less than 11% of $T_1$. Temperature $T_0 \pm \delta_0$ in the first phase is selected such that the glass sheet will not break due to dilatation mismatch when the bend region is sectionally heated to temperature $T_1 \pm \delta_1$. At temperature $T_1 \pm \delta_1$, the glass has a relatively low viscosity, e.g., $\leq 10^9$ Poise or in a range from $10^8$ Poise to $10^9$ Poise. At temperature $T_1 \pm \delta_1$, the viscosity of the glass is low enough that the glass can be permanently deformed. Temperature $T_1 \pm \delta_1$ may be between the annealing point and softening point of the glass. In one embodiment, temperature $T_1 \pm \delta_1$ is at least 20° C. below the softening point.

In the second phase, while the localized heat is sectionally heating the bend region, an actuated force with an adjustable amplitude is applied to the bend region. The actuated force produces a bend in each section of the bend region that is at temperature $T_1 \pm \delta_1$. Since the actuated force is applied over the period that the localized heat is applied to and translated along the bend region, the actuated force will produce a bend in different sections of the bend region at different times. The sections in the bend region are contiguous or physically indistinct so that the bends produced in them combine to form a predetermined bend in the bend region. In other words, each bend formed in each section is a segment of a predetermined bend to be formed in the bend region.

The process forms a bend profile incrementally. The resolution of the process can be fine-tuned via the size of the localized heat to allow a splined profile of any complexity to be formed with high accuracy. The process can be used to make 3D glass articles having flat areas with high optical quality and flatness and bend areas with curvatures. The high optical quality in the flat area will be achieved in part by keeping the flat area at a relatively high viscosity while forming the curvatures in the bend area. At the relatively high viscosity, deformation of the glass in the flat area or introduction of surface defects in the flat area can be avoided.

The process does not require use of a conforming mold, enabling reduction in manufacturing cost per 3D glass article and reduction in time to change from one 3D glass article design to another. As will be demonstrated below, the process has a very high level of flexibility, enabling quick response to requests for prototypes. The process works efficiently for small and large substrate sizes. The process is capable of forming small and large bends. Large bends greater than 90° can be formed. Large bends greater than 180° can also be formed. The desired level of accuracy and cycle time can be achieved easily by adapting the size of the localized heat and bending recipe.

Figure 1:
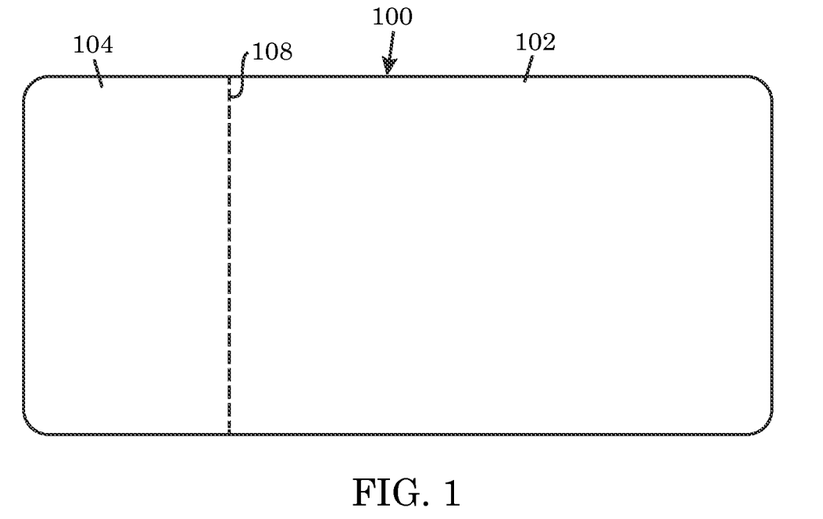
FIG. 1 shows a glass sheet.

The process can be further described with reference to the drawings. FIG. 1 shows a glass sheet 100 that can be reformed into a 3D glass article using the process. The glass sheet 100 has been divided into two contiguous regions—a flat region 102 and a bend region 104. It is quite possible to divide the glass sheet 100 into more than two contiguous regions. For example, if two bends are to be formed in the glass sheet, then the glass sheet may have three contiguous regions—one flat region and two bend regions. The division mentioned above is not physical. That is, the line 108 shown between the regions 102, 104 does not represent a physical boundary or marking in the glass sheet 100. The flat region 102 and bend region 104 are flat. The bend region 104 is so named because after the glass sheet 100 is reformed into a 3D glass article, the bend region 104 will be a bend or include a bend. The flat region 102 will remain flat in the 3D glass article.

For a bend recipe, a bend profile to be formed in the bend region 104 is determined. The bend profile is then divided into N contiguous profile segments, where N is an integer greater than 2. N will depend on the complexity of the bend profile and desired accuracy of the bend when formed in the bend region 104. Each profile segment has a local radius of curvature and a length. The profile segments may have equal or unequal lengths. In general, the higher N is, the higher the accuracy of the bend may be. The segmented bend profile will be mapped to the bend region during the second phase of the process.

Figure 2:
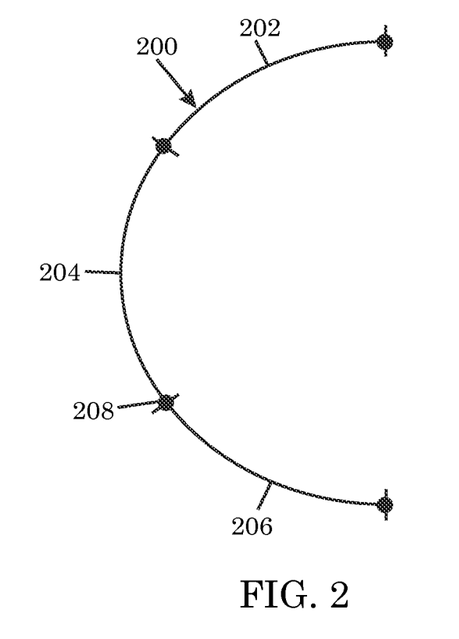
FIG. 2 shows a bend profile.

FIG. 2 shows an example of a bend profile 200, which should not be considered as the only type of bend profile that could be formed in the bend region 104. As an example, the bend profile 200 is divided into three profile segments 202, 204, 206, as indicated by the markers 208. A bend recipe can be prepared based on this segmentation of the bend profile. The bend recipe will basically include information about the actuated force and localized heat to be applied to the bend region to form each segment of the bend profile in the bend region.

Figure 3:
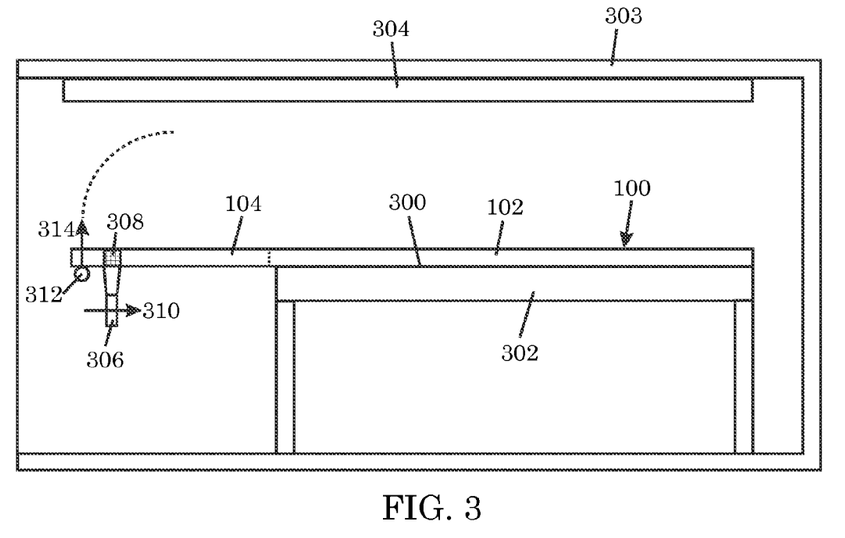
FIG. 3 shows a setup for bending a glass sheet.

In FIG. 3, the glass sheet 100 is arranged on a flat surface 300 of a support 302. The arrangement of the glass sheet 100 is such that the flat region 102 of the glass sheet 100 rests on the flat surface 300 and the bend region 104 overhangs the support 302. Preferably the support 302 is shaped, or the overhanging of the bend region 104 is sufficient, such that the support 302 will not interfere with bending of the glass sheet 100 in the bend region 104. The support 302 and glass sheet 100 are arranged in an oven 303. A global heater 304 at the top of the oven 303 is in opposing relation to the glass sheet 100 and is of a size that can deliver heat to the entire glass sheet 100. Any suitable heating elements may be included in the global heater 304. For example, the heating elements may be resistive heating elements or infrared heating elements or inductive heating elements or gas burners. In the first phase of the process, the global heater 304 will be operated to heat the entire glass sheet 100 to temperature $T_0 \pm \delta_0$, as described above. The support 302 will be heated along with the glass sheet 100. The global heater 304 may be operated to maintain the temperature of the oven 303 at temperature $T_0 \pm \delta_0$ during the first and second phases of the process.

A local heater 306 is arranged in opposing relation to the bend region 104 to deliver localized heat to the bend region 104. The localized heat is shown as heat band 308 in the bend region 104. During the second phase of the process, the local heater 306 is translated relative to the glass sheet 100, as indicated by the arrow 310. As the local heater 306 is translated, the heat band 308 moves along the bend region 104. Typically, the heat band 308 will be confined to the bend region 104 and will not enter the flat region 102. The local heater 306 will be translated along the bend region 104 over a period of time sufficient to form the desired bend profile in the bend region 104. During the second phase, any part of the glass sheet 100 that is not being heated by the heat band 308 at any given time will attempt to reach thermal equilibrium with the temperature in the oven 303, which would be controlled to temperature $T_0 \pm \delta_0$. For the flat region 102 that would not be heated at all by the heat band 308, the temperature of the flat region 102 will remain at or near temperature $T_0 \pm \delta_0$ during the entire second phase.

The local heater 306 may be a resistive heater, infrared heater, inductive heater, gas burner, or any other type of heater that can provide adequate heat to the bend region 104. A focusing element may be used to focus the output of the local heater 306 to the desired dimension of the heat band 308. U.S. Provisional Application No. 61/546687 discloses elliptical mirrors and shields as examples of focusing elements.

Figure 4:
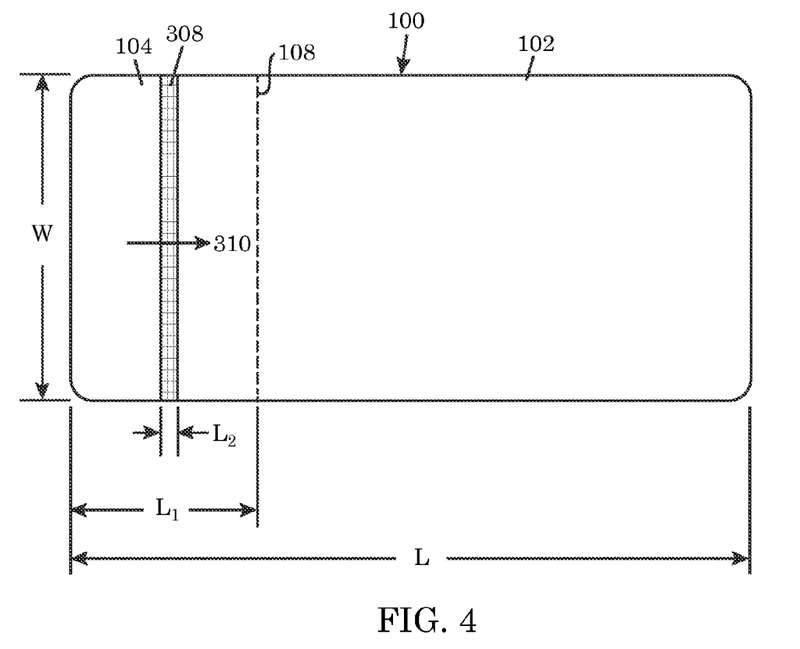
FIG. 4 shows dimensions of a heat band relative to a bend region of a glass sheet.

The resolution of the local heater is determined by the smallest profile segment to be formed in the bend region 104. This can be further explained by illustration. FIG. 4 shows the glass sheet 100 with dimensions L and W and the bend region 104 with dimensions $L_1$ and W, where $L_1 < L$.

The heat band 308 produced by the local heater system has dimensions $L_2$ and W. The heat band 308 is shown as a rectangle, but it may have other shapes. Typically, the heat band 308 and bend region 104 will have one dimension in common, such as the dimension W. However, $L_2 \ll L_1$. If the bend profile 200 of FIG. 2 is to be formed in the bend region 104, then dimension $L_2$ of the heat band 308 should be selected as the smallest of the physical lengths of the profile segments 202, 204, 206 of FIG. 2.

The dimension $L_1$ of the bend region 104 can be considered as the size of the bend region 104 in the direction 310 in which the local heater is translated or the heat band 308 is moving. The dimension $L_2$ of the heat band 308 can be considered as the size of the heat band 308 in the direction 310. As noted previously, $L_2 \ll L_1$. For example, $L_1/L_2 > 2$, where $L_2$ is determined by the desired accuracy of the bend profile to be formed in the bend region 104. Typically, the smaller $L_2$ is, the better the bend profile can be fine-tuned.

In FIG. 3, at whichever section of the bend region 104 the heat band 308 is located, the heat band 308 will attempt to heat that section to temperature $T_1 \pm \delta_1$, as described above. The glass at temperature $T_1 \pm \delta_1$ will be at a viscosity where it can be deformed permanently. Thus deformation of the bend region 104 in order to form a bend profile in the bend region 104 will occur section by section, or incrementally, according to the location of the heat band 308. The local heater 306 may be translated such that the heat band 308 is at one section of the bend region 104 for a time period, then at another section of the bend region 104 for another time period, and so on. Alternatively, the local heater 306 may be translated such that the heat band 308 is continuously moving along the bend region 104. In this case, heating of the bend region 104 will occur in a rolling fashion along the bend region 104 in concert with motion of the heat band 308. Whether the local heater 306 is translated periodically (i.e., at scheduled intervals as determined by the recipe) or continuously, the bend profile will be formed incrementally, i.e., bit by bit, in the bend region 104 as a function of the location of the heat band 308 in the bend region 104.

An actuated arm 312 is used to apply a bending force to the bend region 104. As indicated by arrow 314, the actuated arm 312 is displaced through a predetermined angle depending on, and sufficient for, the bend angle to be formed. For example, for a 180° bend, the actuated arm 312 may be displaced through an angle between 165° and 180°, depending on the thickness of the actuated arm 312. The actuated arm 312 travels along a curvilinear path, which may be a curved path, while being angularly displaced. While the actuated arm 312 is being translated along the curvilinear path, it is in contact with the bend region 104 and pushing the bend region 104 at the contact point. The actuated arm 312 contacts the bend region 104 at or near the boundary of the bend region 104. Typically, the actuated 310 arm does not contact the bend region 104 where the heat band 308 is located or would be located through the course of forming the bend profile in the bend region in order to avoid forming defects in the bend region 104. The distance the actuated arm 312 travels along the curvilinear path during a given time period is the actuated amplitude. The actuated amplitude and contact angle of the actuated force can be set for each profile segment. A bend recipe would include sets of values for these parameters along with the desired location and duration of the heat band 308 for each set.

Figure 5A:
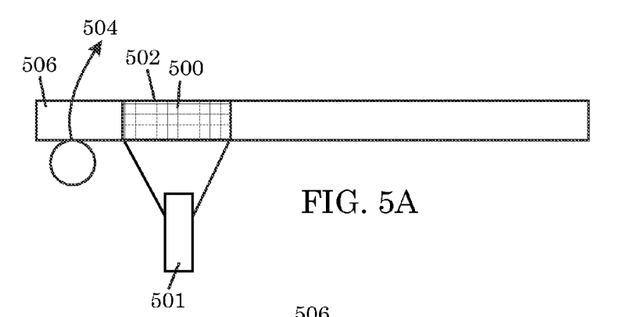
FIGS. 5A-5D show a sequence of forming a shaped glass article.

FIGS. 5A-5D show a sequence of bending a glass sheet using the principles described above. In FIG. 5A, a heat band 500 produced by a local heater 501 is at a first bend section 502 of a bend region 506. An actuated force 504 is being applied to the bend region 506. When the first bend section 502 is at a low viscosity where it can be deformed, the actuated force 504 will produce an elementary bend in the first bend section 502.

Figures 5B, 5C, 5D:
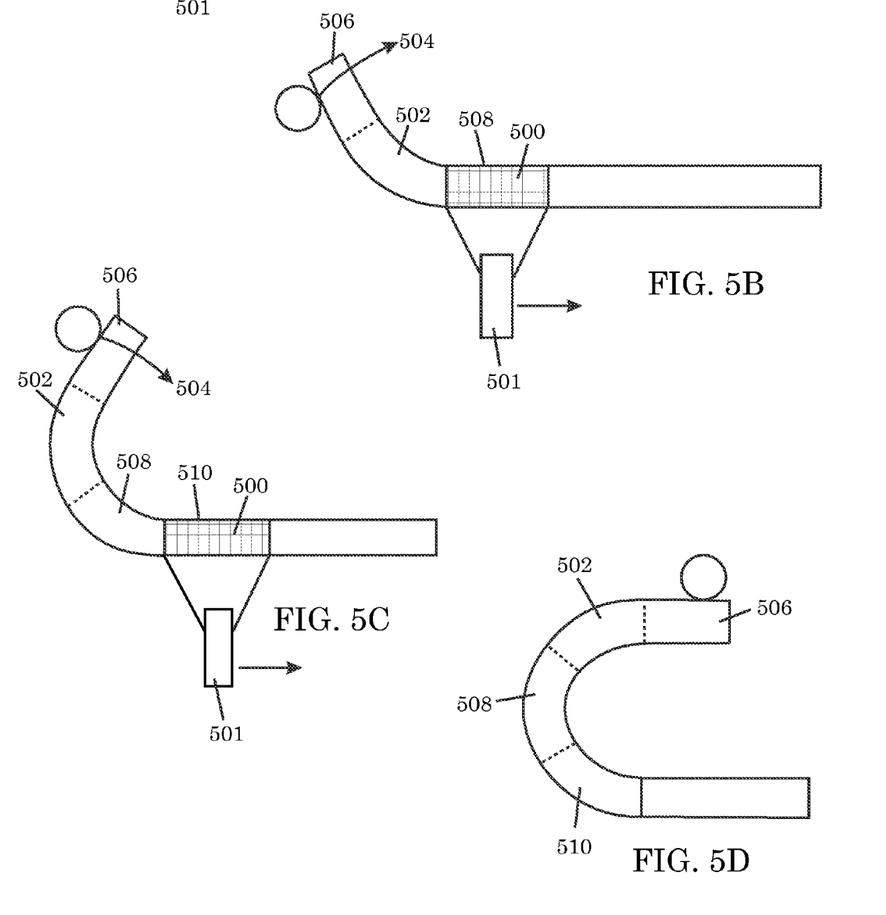

In FIG. 5B, an elementary bend has been produced in the first bend section 502. Also, the heat band 500 has been translated to a second bend section 508. When the second bend section 508 is at a low viscosity where it can be deformed, the actuated force 504 will produce an elementary bend in the second bend section 508. Meanwhile, since the heat band 500 is no longer at the first bend section 502, the temperature of the first bend section 502 will start to drop to the temperature in the oven.

In FIG. 5C, an elementary bend has been produced in the second bend section 508. Also, the heat band 500 has been translated to the third bend section 510. When the third bend section 510 is at a viscosity where it can be deformed, the actuated force 504 will produce an elementary bend in the third bend section 510. Meanwhile, since the heat band 500 is no longer at the second bend section 508, the temperature of the second bend section 508 will start to drop to the temperature of the oven.

In FIG. 5D, an elementary bend has been produced in the third bend section 510. The temperature of the first bend section 502 is now at the temperature of the oven. Having cooled down to a relatively high viscosity, the first bend section 502 can now permanently hold its elementary bend. The temperature of the second bend section 508 is still dropping. At this point, the local heater has been turned, which would allow the temperature of the third bend section 510 to also start dropping to the temperature of the oven. Eventually, the second bend section 508 and third bend section 510 will cool down enough to permanently hold their elementary bends. While the second bend section 508 and third bend section 510 are cooling down to the oven temperature, the previously actuated force can become a static, holding force. The elementary bends formed in the bend sections 502, 508, 510 are contiguous and together make up the desired bend profile in the bend region 506.

Figure 6A:
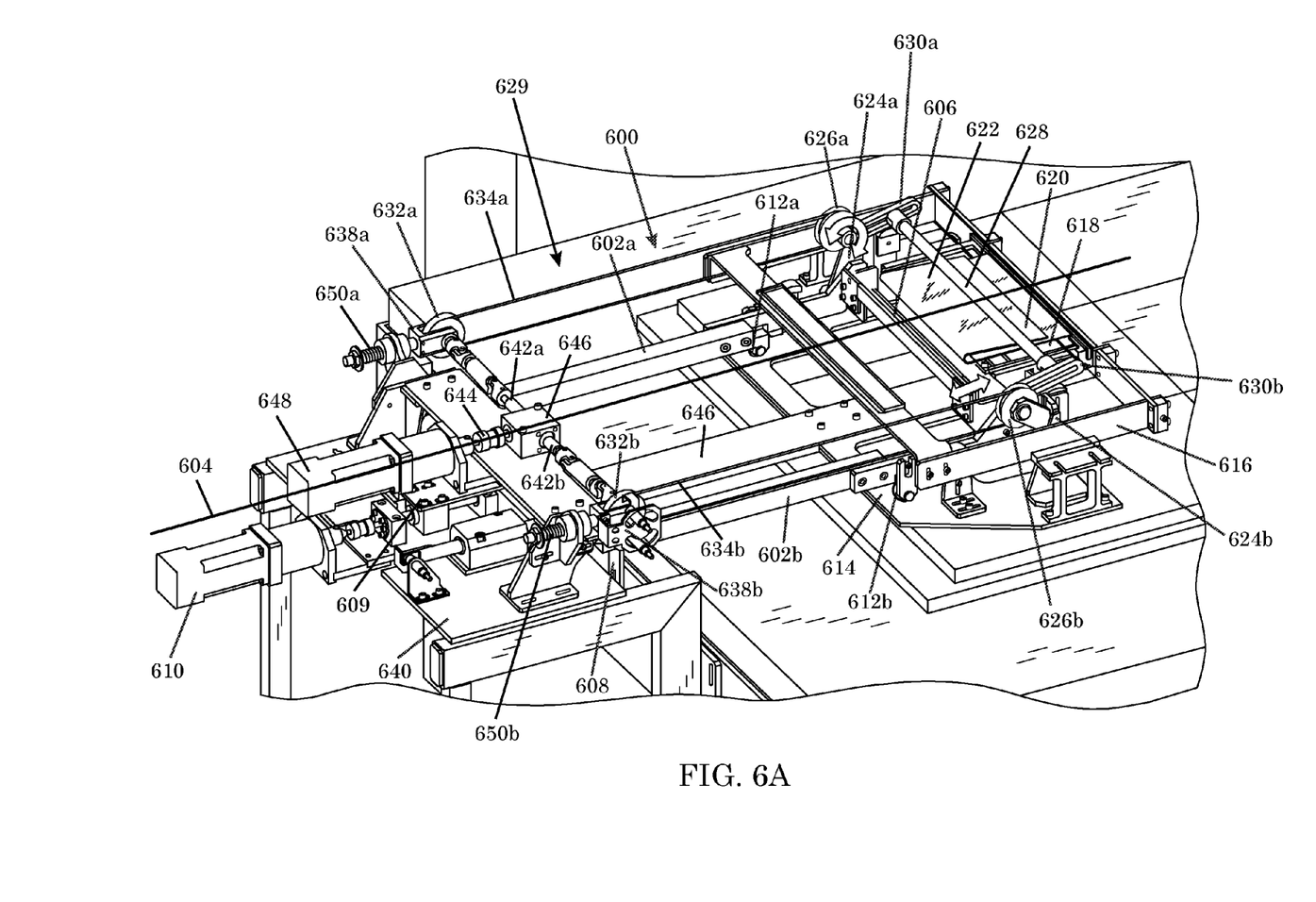
FIGS. 6A-6B show an apparatus for bending a glass sheet.

FIG. 6A shows an apparatus 600 for bending a glass sheet according to another aspect of the present invention. The apparatus 600 includes actuator arms 602a, 602b arranged in parallel to a linear axis 604. A heater 606 is arranged between the actuator arms 602a, 602b. The heater 606 is attached to the shaping ends of the actuator arms 602a, 602b. Preferably, the attachment is not permanent so that the heater 606 can be replaced as desired. The driving ends of the actuator arms 602a, 602b are attached to a plate 608, which is coupled to a linear actuator 609 mounted on a base 640. The linear actuator 609 is driven by a motor 610. The motor 610 may be a servomotor or other motor whose output can be precisely controlled, e.g., a stepper motor. Rollers 612a, 612b are coupled to the bottom of the actuator arms 602a, 602b to allow the actuator arms 602a, 602b to move relatively freely in response to the output of the motor 610. The rollers 612a, 612b are constrained to move in a direction parallel to the linear axis 604. The heater 606 is thus translated along the linear axis 604 by operating the motor 610 and linear actuator 609 to move the actuator arms 602a, 602b along the linear axis 604. The rollers 612a, 612b are arranged to roll on a base 614 during the translation of the heater 606.

Figure 6B:
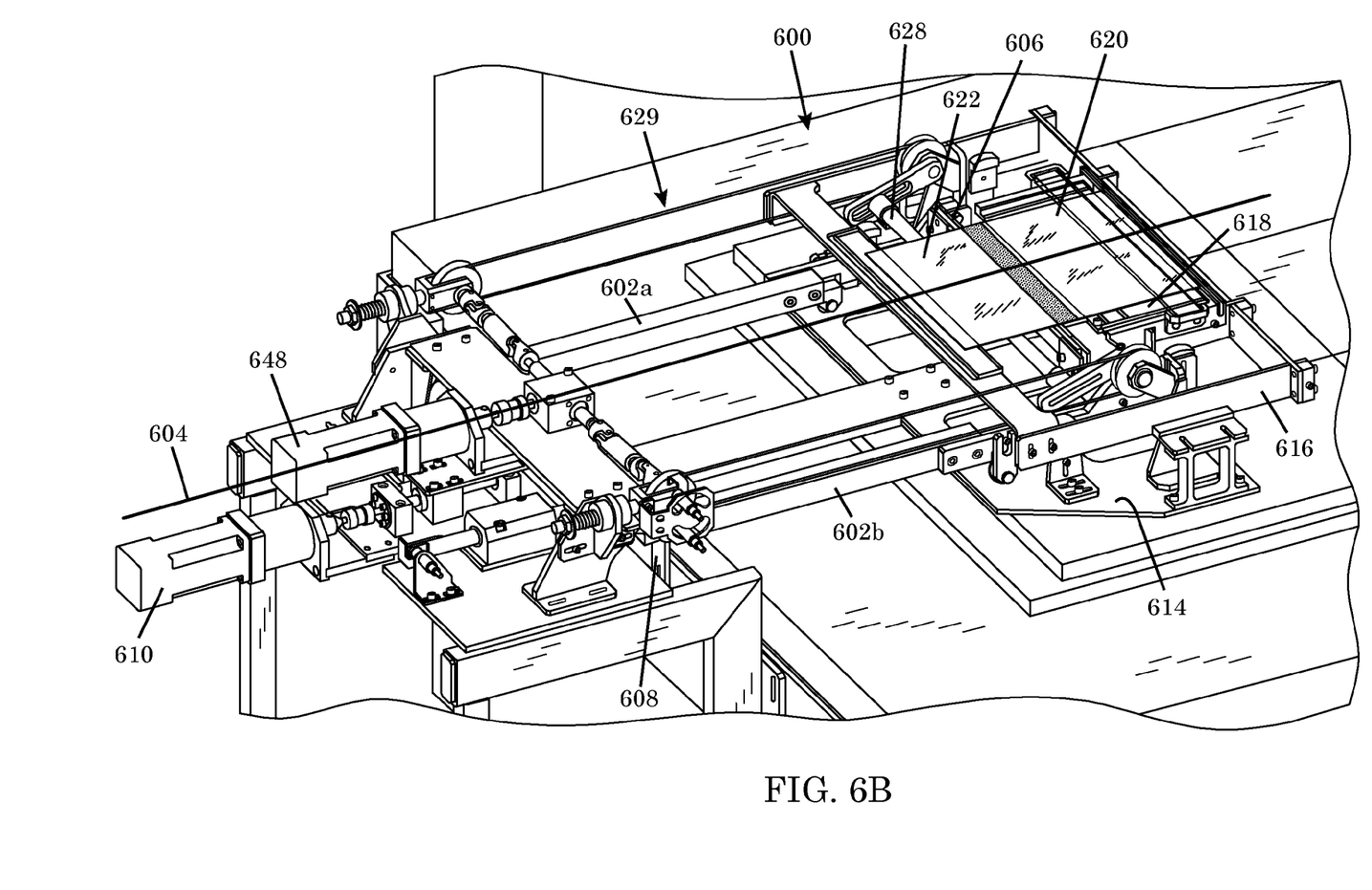

A glass support 618 is attached to a frame 616 mounted on the base 614. The glass support 618 is parallel to the actuator arms 602a, 602b and in opposing relation to the heater 606. A glass sheet 620 that is to be bent can be placed on the glass support 618 such that the bend region 622 of the glass sheet 620 overhangs the glass support 618 (see FIG. 6B). When the actuator arms 602a, 602b move, the heater 606 is translated underneath the bend region 622. In this way, a band of heat applied by the heater 606 to the bend region 622 will be translated along the bend region 622 (see FIG. 6B).

The apparatus 600 includes an actuator arm 628 for applying an actuated force to the glass sheet 620 as the heater 606 is translated underneath the bend region 622. The apparatus 600 includes a pulley mechanism 629 for moving the actuator arm 628 along a curvilinear path in order to form a bend with a predetermined angle. With the pulley mechanism 629, bend angles greater than 180° can be formed. Other types of mechanisms may be used to actuate the actuator arm 628. For example, a lever or a rack-and-pinion mechanism may be used. The bend angle will typically be limited to less than 180° if a lever is used. With a rack-and-pinion mechanism, the bend angle can be greater than 180°, but thermal expansion of the rack or heater will make it difficult to achieve the desired bending accuracy. When the apparatus 600 is in use, a portion of the apparatus 600 will typically be inside an oven, typically operating at 600° C. to 700° C., while the remainder of the apparatus 600 will be outside the oven. In this setting, at least a portion of the rack will be inside the oven. Thus the rack will expand with temperature variations inside the oven. This expansion will induce unintended motion in the actuator arm 628. Also, thermal expansion of the actuator arm 628 will tend to rotate the pinion. The pulley mechanism 629 accounts for thermal expansion that may result in bending inaccuracies so that the actuator arm 628 can be accurately positioned against the bend region 622 when executing a bend recipe.

The pulley mechanism 629 includes wheels 626a, 626b, which are mounted on wheel supports 624a, 624b in a manner that allows them to be rotatable. The wheel supports 624a, 624b are mounted on the base 614 and are arranged in parallel to, and on either side of, the glass support 618. The actuator arm 628 is coupled to the wheels 626a, 626b by linkages 630a, 630b, respectively. Opposite the wheels 626a, 626b are wheels 632a, 632b on wheel mounts 638a, 638b, respectively. Wheels 632a, 632b are rotatable on the wheel mounts 638a, 638b, which are mounted on the base 640. Cable 634a is wound around wheel 632a at least once and then over the wheel 626a. Similarly, cable 634b is wound around wheel 632b at least once and then over the wheel 626b. The output shafts 642a, 642b of a gear box 646 is coupled to wheels 632a, 632b. The gear box 646 is coupled to the output shaft 644 of a motor 648. The motor 648 may be a servomotor or any other motor whose output can be precisely controlled, e.g., a stepper motor. The gear box 646 is used to distribute the output of the motor 648 to the wheels 632a, 632b. The cables 634a, 634b transfer the motion of the wheels 632a, 632b to the wheels 626a, 626b, respectively. The cables 634a, 634b are made of a material that will be stable at elevated temperatures, e.g., temperatures up to 700° C. A suitable example of cable material is INCONEL. Instead of cables, metal strip belts may be used. The metal strip belts would also be made of a material that will be stable at elevated temperature, e.g., temperatures up to 700° C. Springs 650a, 650b are used to maintain tension on the cables 634a, 634b, respectively. The springs 650a, 650b act by biasing the wheels 632a, 632b in a direction away from the wheels 626a, 626b, respectively.

The apparatus 600 has a hot side, i.e., the side where the glass sheet 620 is supported, and a cold side, i.e., the side where the motors 610, 648 are supported. The hot side of the apparatus 600 will be arranged in a hot environment, such as an oven, when the apparatus 600 is in use. The cold side will be arranged in a cold environment, such as a room, when the apparatus 600 is in use. Thus the apparatus 600 will straddle a hot and cold environment when in use. The actuator arms 602a, 602b extend between the hot and cold sides of the apparatus 600. When the apparatus 600 is in use, the actuator arms 602a, 602b will experience thermal expansion that will fluctuate with the hot environment. This thermal expansion will cause the heater 606 to drift. This drifting is not the same as moving the heater 606 according to a bend recipe. This drifting is parasitic motion not dictated by the bend recipe. If this drift is not compensated for, the heater 606 can deviate from its desired position relative to the glass sheet 620, resulting in inaccuracies in the bend profile being formed.

To compensate for the drift of the heater 606, a rigid link is formed between the hot and cold sides of the apparatus 600. The rigid link is subject to the same thermal conditions as the actuator arms 602a, 602b so that it expands in the same way that the actuator arms 602a, 602b are expanding, thereby causing the glass support 618 to drift simultaneously with the heater 606. Since the glass sheet 620 is mounted on the glass support 618, there will be no net relative movement between the glass sheet 620 and heater 606 due to thermal expansion of the actuator arms 602a, 602b. The rigid link is provided by a rigid bar or compensation 646, which has its ends connected or coupled to the bases 614, 640. The compensator arm 646 is arranged in parallel with the actuator arms 602a, 602b. Also, the thermal expansivity of the compensation arm 646 is the same as that of the actuator arms 602a, 602b. This could be achieved easily by making the actuator arms 602a, 602b and compensation arm 646 of the same material, and sensibly equivalent cross-section, i.e., for thermal leak kinematic mismatch refraction. The material would need to be able to withstand high temperatures of an oven, e.g., temperatures of 600° C. to 700° C. Typically, the material would be refractory metal alloy.

The glass support 618 drifts because the base 614 to which it is coupled is drifting. The actuator arm 628 is coupled to the wheels 626a, 626b, which are also coupled to the base 614 that is subject to drifting. As such, the actuator arm 628 will drift in the same manner as the glass support 618. To maintain the desired relationship between the actuator arm 628 and the glass sheet 620 in the presence of thermal expansion, the drift of the wheels 626a, 626b will also need to be compensated for. This compensation is built into the pulley mechanism 629. The cables 634a, 634b (or metal strip belts if used in lieu of cables) act as rigid (or taut) links between the paired pulley wheels 626a, 626b and 632a, 632b, respectively. The pulley wheels 632a, 632b are in turn coupled to the base 620 as described above. Therefore, the rigid (or taut) links provided by the cables 634a, 634b (or metal strip belts if used in lieu of cables) are ultimately between the bases 614, 620 or between the hot and cold sides of the apparatus 600.

Figure 7A:
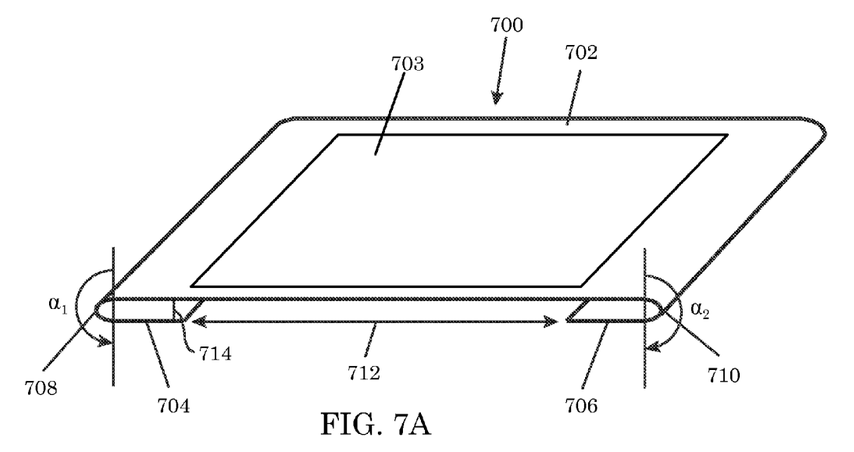
FIG. 7A shows a glass casing.
Figure 7B:
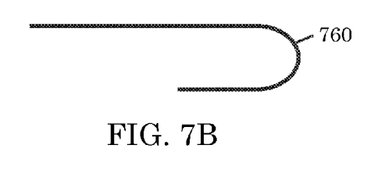
FIGS. 7B-7E show side bend profiles.
Figure 7C:
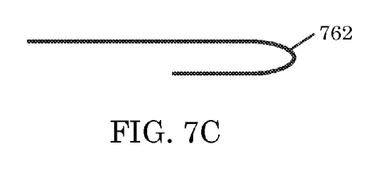
Figure 7D:
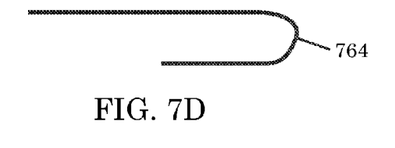
Figure 7E:
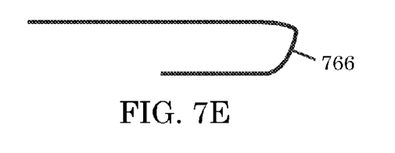

FIG. 7A shows a glass casing 700 according to another aspect of the present invention. The glass casing 700 may be made using the process and apparatus described above. The glass casing 700 can be used as a housing and protection for the innards of an electronic device. The glass casing 700 has a front cover 702 and back flaps 704, 706. The front cover 702 is in opposing relation to the back flaps 704, 706 and is joined to the back flaps 704, 706 by side bends 708, 710. The glass casing 700 is made from a single glass sheet. Therefore, there are no physical seams or joints between the front cover and side bends and between the side bends and adjoining back flaps.

In the embodiment shown in FIG. 7A, the front cover 702 and back flaps 704, 706 are flat. In other embodiments, the back flaps may have some curvature, but the front cover 702 will usually be flat. In this embodiment, the front cover 702 is parallel to the back flaps 704, 706. In other embodiments, the front cover 702 may not be parallel to the back flaps 704, 706. In this embodiment, the back flaps 704, 706 do not touch, leaving a window 712 at the back of the glass casing 700. In one embodiment, the side bends 708, 710 are curved and have bend angles, $\alpha_1$, $\alpha_2$, respectively, each of which is larger than 90°. Preferably, the side bends 708, 710 have bend angles of approximately 180° or greater. The bend profiles may be symmetric or asymmetric and may have simple or compound curvatures. Various examples of bend profiles are shown in FIGS. 7B-7E at 760, 762, 764, and 766.

The front cover 702, back flaps 704, 706, and side bends 708, 710 define a compartment 714 inside of which an electronic device may be arranged. The radiuses of the side bends 708, 710 determine the height of the compartment 714. The radiuses of the side bends 708, 710 may be the same or different, which means that the height of the compartment 714 may or may not be uniform between the side bends 708, 710. The dimensions of the glass casing 700 will depend on the target application. For electronic tablet or slate applications, the bend radiuses may vary from, for example, 2 mm to 7 mm, preferably from 3 mm to 5 mm. This would indicate how tall the compartment 714 may be. The overall thickness of the glass casing 700 may range from 6 mm to 8 mm. The walls and bends of the glass casing 700 consist of thin-walled glass. The thickness of the thin-walled glass may range from 0.7 mm to 1 mm. However, these numbers are just examples and do not limit the structure of the glass casing 700.

The glass casing 700 is preferably made of high-strength, scratch-resistant glass. In general, the strength and scratch resistance requirements may be satisfied by chemically strengthening pristine glass by ion-exchange. This would require that the glass is of a composition that can be ion-exchanged, such as a composition containing small alkali or alkaline-earth metal ions that can be exchanged for large alkali or alkaline-earth metal ions. Typically, glasses that can be subjected to ion-exchange processes are alkali-aluminosilicate glasses or alkali-aluminoborosilicate glasses. Specific examples of ion-exchangeable glasses are disclosed in U.S. Pat. No. 7,666,511 (Ellison et al; 20 Nov. 2008), U.S. Pat. No. 4,483,700 (Forker, Jr. et al.; 20 Nov. 1984), and U.S. Pat. No. 5,674,790 (Araujo; 7 Oct. 1997); U.S. patent application Ser. No. 12/277,573 (Dejneka et al.; 25 Nov. 2008), Ser. No. 12/392,577 (Gomez et al.; 25 Feb. 2009), Ser. No. 12/856,840 (Dejneka et al.; 10 Aug. 2010), Ser. No. 12/858,490 (Barefoot et al.; 18 Aug. 18, 2010), and Ser. No. 13/305,271 (Bookbinder et al.; 28 Nov. 2010); and U.S. Provisional Patent Application No. 61/503,734 (Dejneka et al.; 1 Jul. 2011). The ion-exchange may occur after the glass casing 700 is formed using the process described above.

Figure 7F:
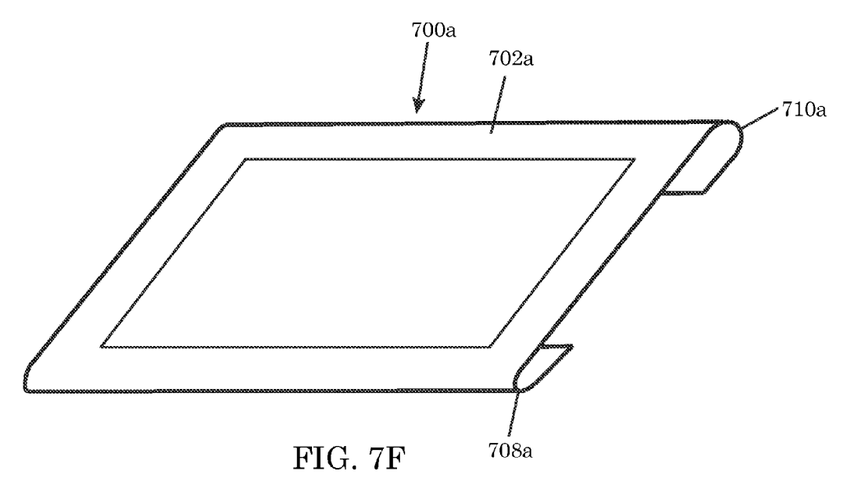
FIG. 7F shows a glass casing with side bends along the long side.

Variations to the glass casing 700 are possible. In glass casing 700, the side bends 708, 710 are placed along the short sides of the front cover 702. In glass casing 700a in FIG. 7F, the side bends 708a, 710a are placed along the long sides of the front cover 702a.

Figure 7G:
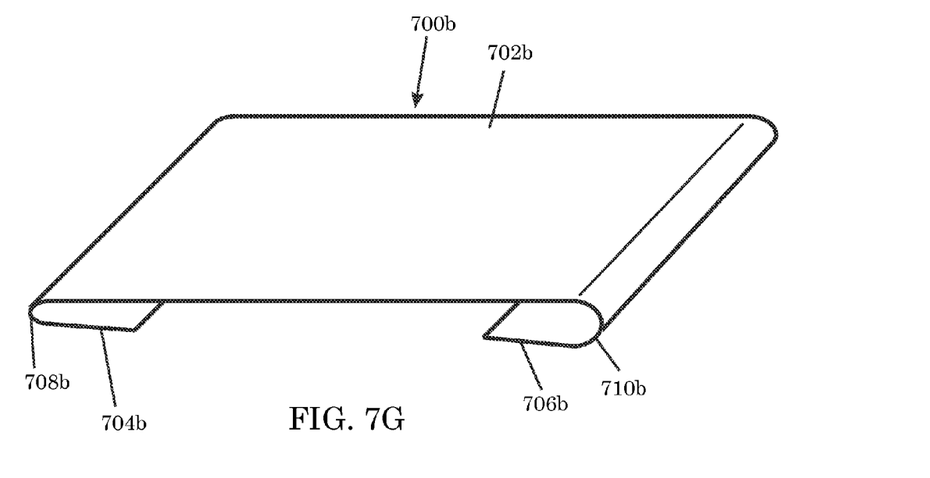
FIG. 7G shows a glass casing with an inclined front cover.

FIG. 7G shows a glass casing 700b where the front cover 702b is inclined to the back flaps 704b, 706b. This is because the side bends 708b, 710b have different radiuses.

Figure 7H:
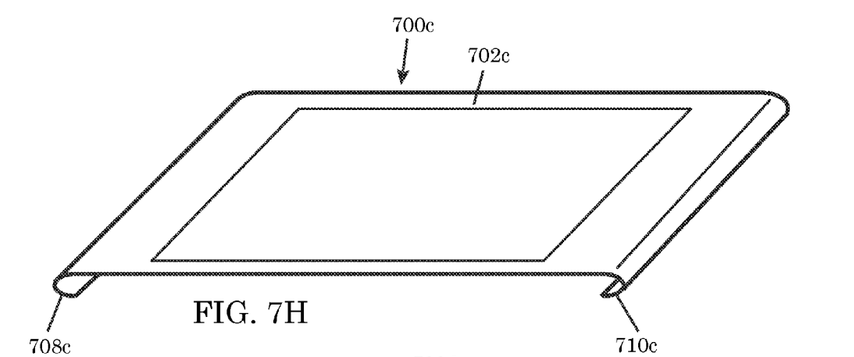
FIG. 7H shows a glass casing without back flaps.

In FIG. 7H, glass casing 700c only has a front cover 702 and adjoining side bends 708c, 710c. There are no back flaps in glass casing 700c.

Figure 7I:
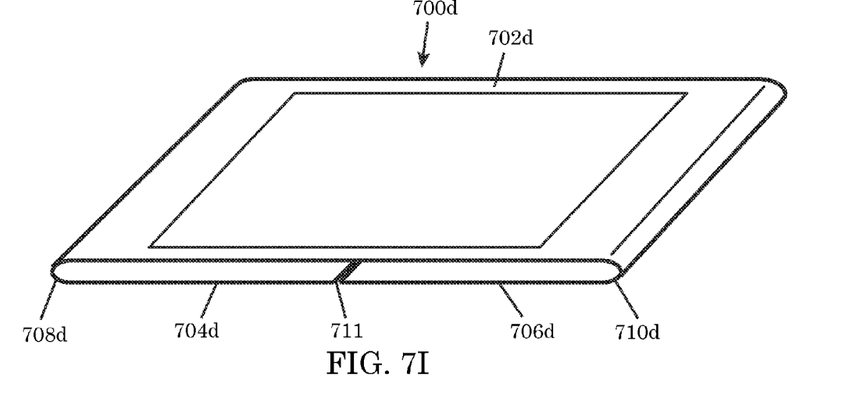
FIG. 7I shows a glass casing without a back window.

FIG. 7I shows a glass casing 700d having top cover 702d, back flaps 704d, 706d, and side bends 708d, 710d, where the back flaps 704d, 706d are touching or almost touching, as shown at 711. The glass casing 700d does not have a back window as in the case of glass casing 700 in FIG. 7A. The glass casing 700d forms a full sleeve, whereas the other glass casings with back windows or without back flaps are fractional sleeves, i.e., fractional sleeves will not completely wrap around an electronic device.

Figure 7J:
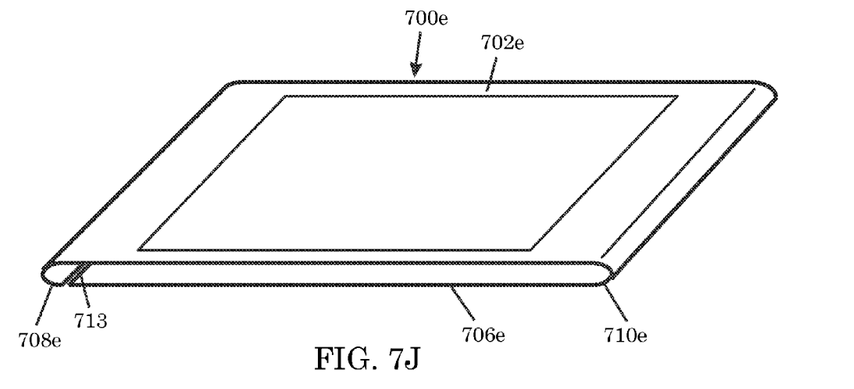
FIG. 7J shows a glass casing with one back flap.

In FIG. 7J, glass casing 700e has a top cover 702e, back flap 706e, and side bends 708e, 710e. Side bend 710e joins back flap 706e to top cover 702e. Side bend 708e is joined to top cover 702e. The back flap 706e extends across the glass casing, touching or almost touching the side bend 708e, as shown at 713. The glass casing 700e also forms a full sleeve.

Figure 8A:
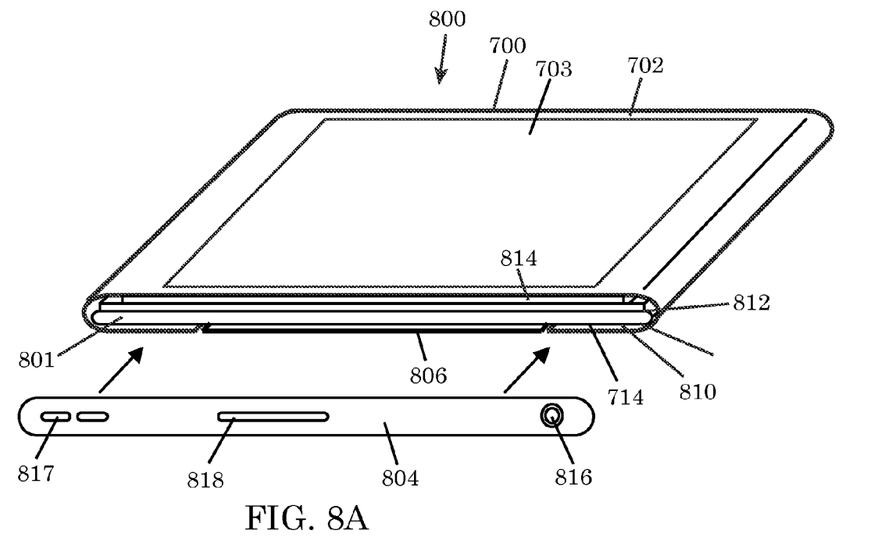
FIG. 8A shows an electronic device with a side plug removed.

FIG. 8A shows an electronic device 800 including a chassis 801 arranged in the compartment 714 of the glass casing 700. Electronic device components, such as battery, which is generally located at 810, motherboard, which is generally located at 812, display device 814, and connectors, are mounted to the chassis 801. The display device 814 is underneath the front cover 702 of the glass casing 700, and a user may interact with the displace device 814 through the front cover 702. The front cover 702 would typically have a clear aperture 703 for interaction with the display device 814. The remainder of the surface of the glass casing 700 may be clear, semi-opaque, or opaque. Decorations may also be formed on the front cover 702, e.g., along the periphery of the clear aperture 703, as needed. For example, decorations may formed on the front cover 702 that correspond to touch-sensitive areas on the display device 814 and serve as visual cues for the user.

Figure 8B:
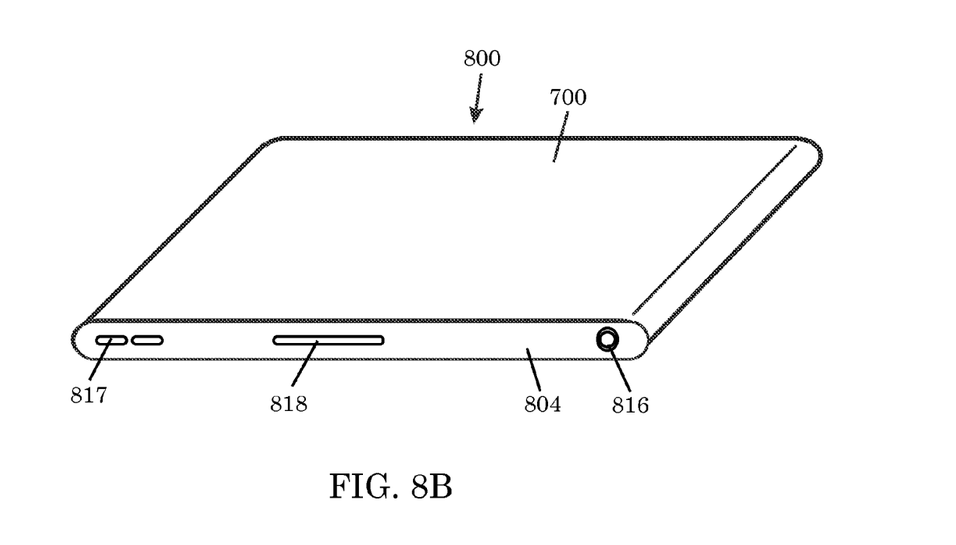
FIG. 8B shows an electronic device in assembled form.

Side plugs 804 that mate with the glass casing 700 are used to seal the exposed sides of the compartment 714 after the chassis 801 is inserted in the compartment 714. The side plugs 804 may carry button(s) 816, 817 and connector(s) 818 for interaction with the electronic device 800. The side plugs 804 may be secured to the glass casing 700 using any suitable means, such as snap-fit connectors, or may be secured to the chassis 801. The side plugs 804 will prevent the chassis 801 from falling out of the compartment 714 and will also protect the edges of the glass casing 700. A back plug or plate 806 may be fitted in the window at the back of the glass casing 700 in order to fully seal the compartment 714. The back plug 806 may also be secured to the glass casing 700 using any suitable means, such as snap-fit connectors, or may be secured to the chassis 801. Alternatively, a back surface of the chassis 801 may provide the back plug that fits in the window at the back of the glass casing 700. The back plug would not be needed if one of the alternative full-sleeved glass casings is used. The plugs 804, 806 may be made of soft material that can absorb shock if the electronic device 800 is accidentally dropped on its side or back. The soft material may also be self-gripping to reduce the potential of the electronic device 800 slipping off smooth surfaces. FIG. 8B shows the electronic device 800 in assembled form.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A method of bending a glass sheet, comprising:
   placing the glass sheet on a support such that a flat region of the glass sheet rests on a flat surface of the support and a bend region of the glass sheet overhangs the support;
   heating the flat region and the bend region of the glass sheet to a first viscosity;
   applying and translating a band of heat only along a selected region of the bend region of the glass sheet in which a predetermined bend with a select bend angle is to be formed over a time period to form the predetermined bend in the selected region, the selected region comprising a plurality of contiguous sections, each section being separately heated to a second viscosity that is lower than the first viscosity by the band of heat, wherein applying and translating the band of heat comprises translating a heater providing the band of heat relative to the glass sheet while maintaining the flat region of the glass sheet on the flat surface of the support, and wherein the flat region remains substantially at the first viscosity during the applying and translating of the band of heat; and
   applying an actuated force to the bend region of the glass sheet while translating the band of heat along the selected region of the bend region by translating the heater providing the band of heat relative to the glass sheet such that the actuated force produces an elementary bend in each section of the selected region when the section is at the second viscosity without deforming the flat region on the support, wherein the elementary bends are contiguous and together form the predetermined bend with the select bend angle.

2. The method of claim 1, wherein the first viscosity is in a range from $6 \times 10^9$ Poise to $10^{12}$ Poise.

3. The method of claim 2, wherein the second viscosity is less than or equal to $10^9$ Poise.

4. The method of claim 1, wherein a size of the selected region in a direction in which the band of heat is translated is greater than twice a size of the band of heat in the direction in which the band of heat is translated.

5. The method of claim 1, further comprising controlling a temperature of an environment in which the glass sheet is disposed to maintain the portion of the glass sheet not heated by the band of heat above the second viscosity.

6. The method of claim 1, further comprising selecting a bend profile corresponding to the predetermined bend, segmenting the bend profile into at least three profile segments, and applying the band of heat and actuated force to form each of the profile segments in a corresponding section of the selected region.

7. The method of claim 6, further comprising selecting a size of the band of heat based on a length of the smallest of the profile segments.

8. The method of claim 1, wherein applying the actuated force comprises translating an actuator arm in contact with the selected region along a curvilinear path.

9. The method of claim 8, wherein the actuator arm is rotated through an angle between 0 and 90° over the time period in which the predetermined bend is formed.

10. The method of claim 8, wherein the actuator arm is rotated through an angle of of 90° or greater over the time period in which the predetermined bend is formed.

11. The method of claim 1, wherein the translation of the band of heat is at scheduled intervals over the time period.

12. The method of claim 1, wherein the translation of the band of heat is continuous over the time period.

* * * * *